United States Patent
Moll (10) Patent No.: US 6,177,845 B1
(45) Date of Patent: Jan. 23, 2001

(54) FREQUENCY-PROVIDING CIRCUIT

(75) Inventor: Joachim Moll, Herrenberg (DE)

(73) Assignee: Hewlett Packard Company, Palo Alto, CA (US)

(*) Notice: Under 35 U.S.C. 154(b), the term of this patent shall be extended for 0 days.

(21) Appl. No.: 09/338,153

(22) Filed: Jun. 23, 1999

(30) Foreign Application Priority Data

Jul. 13, 1998 (EP) .................................................. 98112953

(51) Int. Cl.$^7$ ....................................................... H03L 7/00
(52) U.S. Cl. .............................. 331/49; 331/55; 331/74; 331/2; 327/141; 327/144; 327/145; 327/146
(58) Field of Search ................................. 331/1 A, 2, 49, 331/55, 74; 327/144, 141, 145, 146

(56) References Cited

U.S. PATENT DOCUMENTS

| | | | |
|---|---|---|---|
| 4,259,744 | 3/1981 | Junod et al. | 331/2 X |
| 5,075,640 | 12/1991 | Miyazawa | 331/10 |
| 5,487,093 | 1/1996 | Adresen et al. | 375/376 |
| 5,757,240 | 5/1998 | Boerstler et al. | 331/34 |

FOREIGN PATENT DOCUMENTS

0345940A2  2/1989 (EP) .

OTHER PUBLICATIONS

European Search Report, EP 98 11 2853 Nov. 18, 1998.

IEEE 1993 Custom Integrated Circuits Conference, Sep. 5, 1993, pp. 4.4.1–4.4.4, Junichi Goto et al., "A Programmable Clock Generator With 50 to 350 MHz Lock Range for Video Signal Processors".

*Primary Examiner*—Arnold Kinkead (57) ABSTRACT

A frequency-providing circuit is disclosed for providing an output signal at a frequency $f_{out}$. The circuit comprises a frequency-generating unit, a frequency-changing circuit, and a synchronizing circuit. The frequency-generating unit receives a frequency-selecting control signal and provides a frequency output at a frequency $f_{osc}$, whereby the frequency-generating unit is switchable between different frequencies substantially without a settling time. The frequency-changing circuit receives the frequency output and a frequency-changing control signal and derives the output signal therefrom, whereby the frequency $f_{out}$ of the output signal can be changed, with respect to the frequency $f_{osc}$, in accordance with the setting of the frequency-changing control signal. The synchronizing circuit synchronizes the frequency-selecting control signal and the frequency-changing control signal.

8 Claims, 5 Drawing Sheets

FREQUENCY-PROVIDING CIRCUIT

FIELD OF THE INVENTION

The present invention relates to a frequency-providing circuit

BACKGROUND OF THE INVENTION

Figure 1:
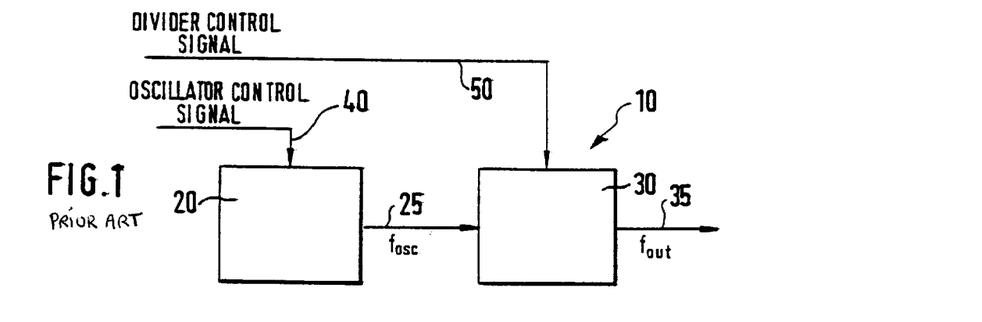
FIG. 1 shows a frequency-providing circuit 10, as known in the art.

FIG. 1 shows a frequency-providing circuit 10, as known in the art, which is typically employed in instruments such as pulse or pattern generators. The frequency-providing circuit 10 comprises an oscillator 20 with a certain frequency range $f_{min}$ to $f_{max}$, an output thereof being coupled via a line 25 to a frequency divider circuit 30. The frequency divider circuit 30 is used to divide an output frequency $f_{osc}$ of the oscillator 20 on line 25 to an output frequency $f_{out} < f_{min}$. For setting the output frequency $f_{out}$, the oscillator 20 receives an oscillator control signal on a line 40 and the frequency divider circuit 30 receives a divider control signal on a line 50.

The range of the output frequency $f_{out}$ can be provided in several sub-ranges in accordance with a selected divide factor DF provided by the divider control signal on line 50 to the frequency divider circuit 30. In case that the frequency range of the oscillator 20 is e.g. $f_{min}:f_{max}=1:2$ with $f_{max}=100$ MHz, the range of the output frequency $f_{out}$ can be provided in several sub-ranges as depicted in the below table:

|  | DF | $f_{out}$ |
| --- | --- | --- |
| Sub-range 1 | 1 | 50.00 ... 100.0 MHz |
| Sub-range 2 | 2 | 25.00 ... 50.00 MHZ |
| Sub-range 3 | 3 | 12.50 ... 25.00 MHz |
| Sub-range n | n | $50/2^n$ ... $100/2^n$ MHz |

When the output frequency $f_{out}$ is to be changed, the oscillator 20 receives a specified oscillator control signal 40 and the frequency divider circuit 30 a specified divider factor DF on line 50.

Figure 2A:
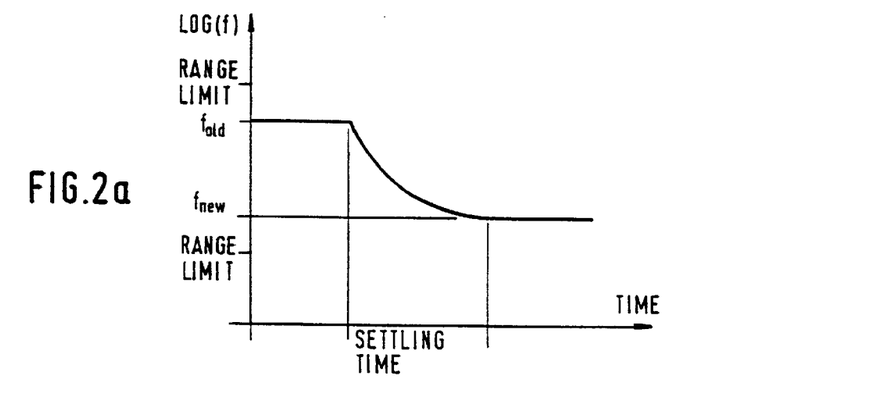
FIGS. 2a and 2b show examples wherein the output frequency $f_{out}$ is to be changed.
Figure 2B:
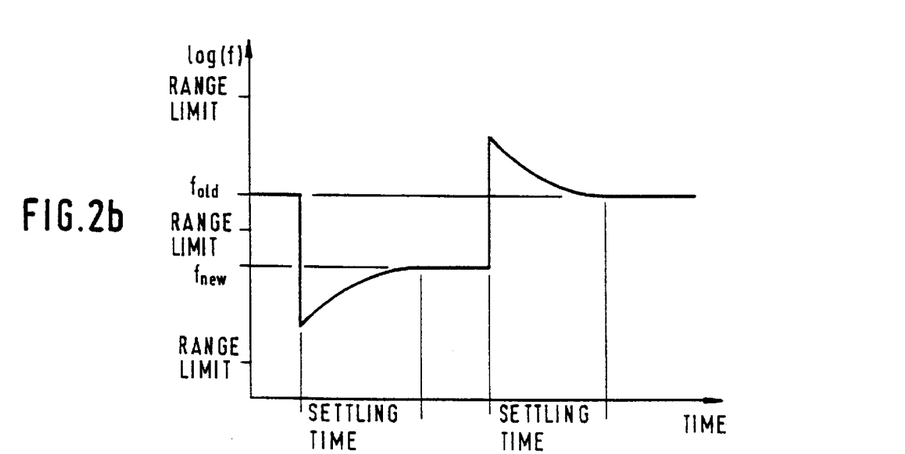

FIGS. 2a and 2b show examples wherein the output frequency $f_{out}$ is to be changed. In FIG. 2a, the output frequency $f_{out}$ is to be changed from a frequency $f_{old}$ to a new frequency $f_{new}$, whereby the two frequencies $f_{old}$ and $f_{new}$ are within one sub-range. The oscillator 20 sweeps between corresponding oscillator frequencies $f_{osc-old}$ to $f_{osc-new}$ within a certain settling time, usually in the range of microseconds up to milliseconds. During that settling time, the output frequency $f_{out}$ changes continuously from $f_{old}$ to $f_{new}$ and is always somewhere between $f_{old}$ and $f_{new}$.

In FIG. 2b, the two output-frequencies $f_{old}$ and $f_{new}$ are in different sub-ranges. The oscillator 20 has to be programmed to a new frequency and the frequency divider circuit 30 has to change the divide ratio. Changing the divider factor DF can happen from one clock period to another while changing the oscillator frequency $f_{osc}$ takes some more time (cf. FIG. 2A). That means that, at the beginning of a change in the output frequency $f_{out}$, the oscillator frequency still remains at the value $f_{osc-old}$ while the divider factor DF has been changed from an old divider factor $DF_{old}$ to a new divider factor $DF_{new}$. Thus, the output frequency $f_{out}$ is immediately changed from a value $f_{out}=f_{osc-old}/DF_{old}$ to a value $f_{out}'=f_{osc-old}/DF_{new}$, whereby the value $f_{out}'$ can exceed the range between the two output-frequencies $f_{old}$ and $f_{new}$. In FIG. 2b, the output frequency $f_{out}$ is first changed between two sub-ranges from $f_{old}$ to $f_{new}$ and then back to $f_{old}$. In contrast to FIG. 2a, the output frequency $f_{out}$ exceeds the range between $f_{old}$ and $f_{new}$ during the respective settling time of the oscillator 20.

As well in the case of FIG. 2a as in case of FIG. 2b it is impossible to provide a new output frequency $f_{out}$ without getting 'wrong' frequencies during the settling time of the oscillator 20. This in particular undesirable when testing the dynamic behavior of circuits like Phase Locked Loops (PLLS) or clock recovery circuits.

A more severe problem, however, occurs in the case of FIG. 2b wherein the output frequency $f_{out}$ exceeds the frequency range between $f_{old}$ and $f_{new}$ during the settling time. This is in particular unacceptable, for example, when a user wants to check an upper operating limit of a circuit, since the frequency change can lead to a much higher frequency than desired. The test circuit can thus produce failures during the settling time or can get out of lock.

SUMMARY OF THE INVENTION

It is an object of the present invention to provide an improved frequency-providing circuit. This object is solved by the independent claims. Preferred embodiments are shown by the dependent claims.

According to the invention, a frequency-providing circuit for providing an output signal at a frequency $f_{out}$ comprises a frequency-generating unit, a frequency-changing circuit, and a synchronizing circuit. The frequency-generating unit receives a frequency-selecting control signal and provides a frequency output at a frequency $f_{osc}$, whereby the frequency-generating unit is switchable between different frequencies substantially without a settling time. The frequency-changing circuit receives the frequency output and a frequency-changing control signal and derives the output signal therefrom, whereby the frequency $f_{out}$ of the output signal can be changed, with respect to the frequency $f_{osc}$, in accordance with the setting of the frequency-changing control signal. The synchronizing circuit synchronizes the frequency-selecting control signal and the frequency-changing control signal.

Another frequency-providing circuit according to the invention comprises a first and a second oscillator, a frequency-selecting unit, and the frequency-changing circuit. The first oscillator receives a first oscillator control signal and provides a first frequency output at a first oscillator frequency $f_{oscA}$. The second oscillator receives a second oscillator control signal and provides a second frequency output at a second oscillator frequency $f_{oscB}$. The frequency-selecting unit receives as inputs the first and second frequency outputs and is controlled by a frequency-selecting control signal for selecting one of the inputs as an output The frequency-changing circuit receives the output of the frequency-selecting unit at a first input and a frequency-changing control signal at a second input and derives the output signal therefrom, whereby the frequency $f_{out}$ of the output signal can be changed with respect to the frequency $f_{osc}$ in accordance with the setting of the frequency-changing control signal.

The invention thus allows an improved switching between different frequencies.

For reducing or avoiding a shift in phase of the output signal when switching between different frequencies, a synchronizing of the switching between the oscillator frequencies has to be provided. The synchronizing circuit therefore preferably comprises means for disabling an application of a successive frequency-selecting control signal and or frequency-changing control signal until the phases of the oscillator frequencies match within a given range.

BRIEF DESCRIPTION OF THE DRAWINGS

Other objects and many of the attendant advantages of the present invention will be readily appreciated and become better understood by reference to the following detailed description when considering in connection with the accompanied drawings in which:

FIGS. 4a and 4c show preferred embodiments of the frequency-providing circuit 100 according to the invention.

FIG. 5b depicts an example of a timing diagram for the circuit in FIG. 5a.

DETAILED DESCRIPTION OF THE INVENTION

Figure 3A:
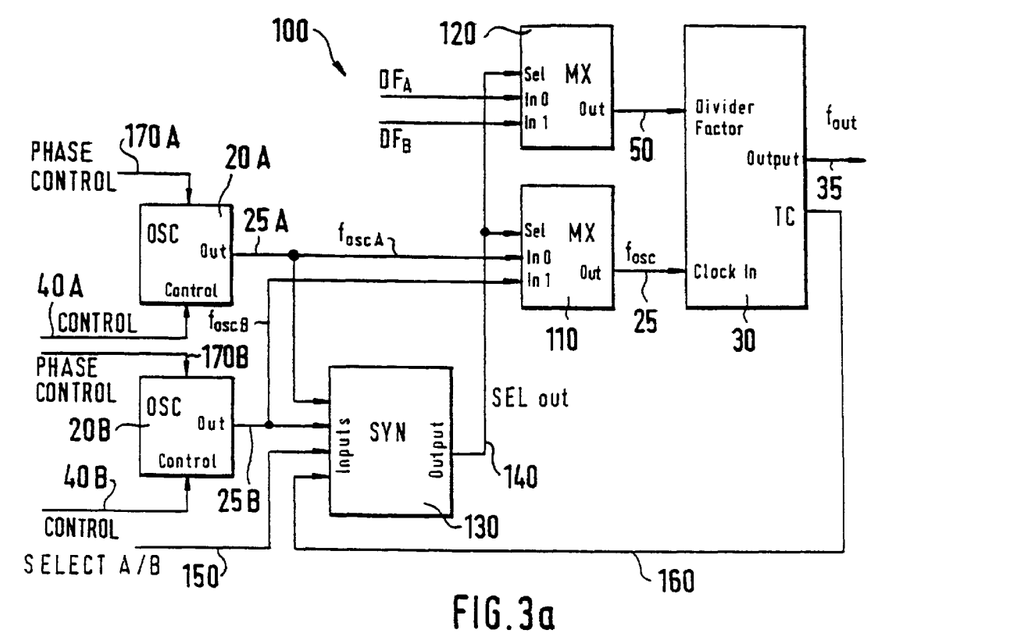
FIG. 3a shows a frequency-providing circuit 100 according to the invention.

FIG. 3a shows a frequency-providing circuit 100 according to the invention. The frequency-providing circuit 100 comprises a first oscillator 20A receiving a first oscillator control signal on a line 40A and providing as an output a first oscillator output with a frequency $f_{oscA}$ on a line 25A. A second oscillator 20B receives a second oscillator control signal on a line 40B and provides as an output a second oscillator output with a frequency $f_{oscB}$ on a line 25B.

A first multiplexer 110 receives as inputs the first oscillator frequency $f_{oscA}$ on line 25A and the second oscillator frequency $f_{oscB}$ on line 25B. A second multiplexer 120 receives as inputs a first divider factor $DF_A$ and a second divider factor $DF_B$. The first multiplexer 110 and the second multiplexer 120 are each controlled by a select signal SEL OUT on a line 140.

The first multiplexer 110 provides as an output the frequency $f_{osc}$ on line 25 to the frequency divider circuit 30 and the second multiplexer 120 provides as an output the divider control signal on line 50 to the frequency divider circuit 30. The frequency divider circuit 30 provides on line 35 the output frequency $f_{out}$ of the frequency-providing circuit 100.

In operation, the first oscillator 20A provides on a line 25A a first oscillator frequency $f_{oscA}$ to the first multiplexer 110 in accordance with the setting of the first oscillator control signal on line 40A. Accordingly, the second oscillator 20B provides on a line 25B a second oscillator frequency $f_{oscB}$ to the first multiplexer 110 in accordance with the setting of the second oscillator control signal on line 40B. Dependent on the setting of the select signal SEL OUT on line 140, the multiplexer 110 either selects the first oscillator frequency $f_{oscA}$ on line 25A or the second oscillator frequency $f_{oscB}$ on line 25B to propagate as $f_{osc}$ on line 25 to the frequency divider circuit 30. Accordingly, the select signal SEL OUT controls the second multiplexer 120 that either the first divider factor $DF_A$ or the second divider factor $DF_B$ propagates as the divider control signal on line 50 to the frequency divider circuit 30. Preferably, the first divider factor $DF_A$ corresponds to the first output frequency $f_{oscA}$ and the second divider factor $DF_B$ corresponds to the second output frequency $f_{oscB}$. In accordance with the applied signals on lines 50 and 25, the frequency divider circuit 30 provides the output frequency $f_{out}$ on line 35.

For changing the output frequency $f_{out}$, the select signal SEL OUT switches the multiplexer 110 so that the second oscillator frequency $f_{oscB}$ will be applied to the frequency divider circuit 30 instead of the first oscillator $f_{oscA}$, or vice versa. Accordingly, the select signal SEL OUT switches the second multiplexer 120, so that the corresponding divider factor is applied on line 50 to the frequency divider circuit 30. The direct switching between the oscillator frequency $f_{oscA}$ and $f_{oscB}$ eliminates the settling time in contrast to the switching from the oscillator frequency $f_{oscA}$ to $f_{oscB}$ as depicted in FIGS. 2a and 2b. Thus, the frequency providing circuit 100 allows changing the frequency $f_{osc}$ on line 25, and accordingly the output frequency $f_{out}$ substantially without any settling time.

It is to be understood that instead of providing the first divider factor $DF_A$ and the second divider factor $DF_B$ and switching between those divider factors, a single divider factor can be directly applied on line 50 to the frequency divider circuit 30, whereby a change of the single divider factor has to be synchronized with the changing of the first and second oscillator frequencies $f_{oscA}$ and $f_{oscB}$. This can be achieved by any means as known in the art.

In a preferred embodiment, the first multiplexer 110 and the second multiplexer 120 are each controlled by a synchronizing circuit 130. The synchronization circuit 130 receives as an input a signal SELECT A/B on a line 150 and provides the select signal SEL OUT on line 140 to the first 110 and second 120 multiplexers. Dependent on the setting of the signal SELECT A/B on line 150, the synchronizing circuit 130 controls the first 110 and second 120 multiplexers via the select signal SEL OUT as explained above. It is to be understood that the synchronizing between the provision of the respective divider factor DF and the select signal SEL OUT can also be accomplished by other means as known in the art e.g. by a general purpose data processing unit.

When the first multiplexer 110 switches from the oscillator frequency $f_{oscA}$ to $f_{oscB}$, or vice versa, a certain phase mismatch between the oscillator frequencies $f_{oscA}$ and $f_{oscB}$ might occur leading to a shift in phase (i.e. a rapid phase change) of the frequency $f_{osc}$ on line 25, and accordingly, to a shift in phase of the output signal of line 35. For reducing or avoiding the shift in phase of the output signal on lines 25 and 35, a synchronizing of the switching between the first and second oscillator frequencies $f_{oscA}$ and $f_{oscB}$ has to be provided. This can be done by any means as known in the art. In a preferred embodiment, the synchronizing circuit 130 receives as additional inputs the first and second oscillator frequencies $f_{oscA}$ and $f_{oscB}$ via lines 25A and 25B. When the signal SELECT A/B on line 150 requests a switching between the oscillator frequencies $f_{oscA}$ and $f_{oscB}$, the synchronizing circuit 130 will wait to emit the respective select signal SEL OUT on line 140 to the first multiplexer 110 until the phases of the oscillator frequencies $f_{oscA}$ and $f_{oscB}$ match within a given range.

Figure 3B:
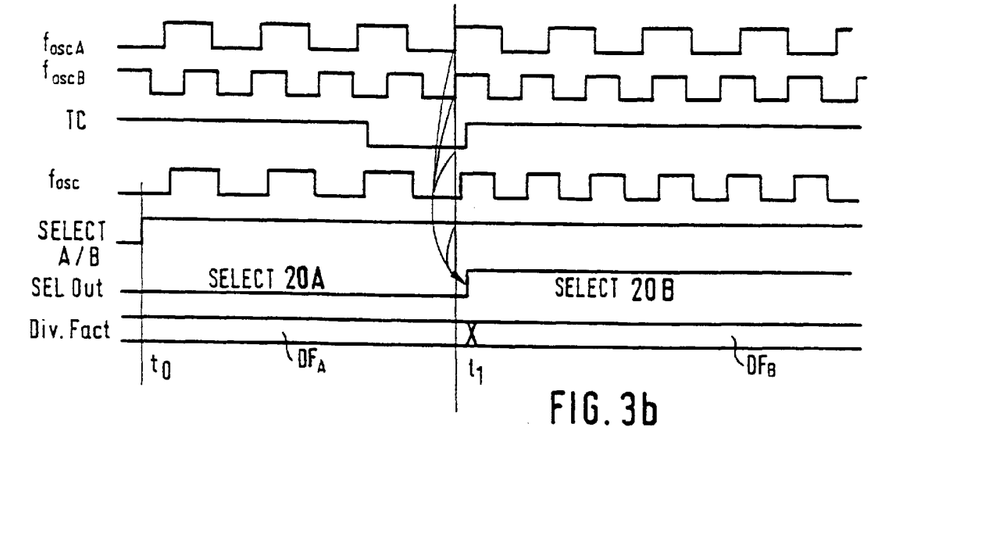
FIG. 3b shows in a timing diagram an example for a switching between the first oscillator frequency $f_{oscA}$ to the second oscillator frequency $f_{oscB}$.

FIG. 3b shows in a timing diagram an example for a switching between the first oscillator frequency $f_{oscA}$ to the second oscillator frequency $f_{oscB}$. At a time $t_0$, the signal SELECT A/B changes from 'low' to 'high' indicating the synchronizing circuit 130 to switch the oscillator frequency $f_{osc}$ on line 25 from the first oscillator frequency $f_{oscA}$ to the second oscillator frequency $f_{oscB}$. At a time $t_1$, the phases of the oscillator frequencies $f_{oscA}$ and $f_{oscB}$ match to a certain degree and the synchronizing circuit 130 will emit a 'high' signal SEL OUT on line 140 requesting the first multiplexer 110 to switch from the first oscillator frequency $f_{oscA}$ to the second oscillator frequency $f_{oscB}$ and the second multiplexer 120 to switch from the divider factor $DF_A$ to the divider factor $DF_B$.

As an additional or further improvement of the frequency and phase matching, when switching from a first to second output frequency $f_{out}$ on line 35, the synchronizing circuit 130 preferably further receives as an input a signal terminal count TC on a line 160 from the frequency divider circuit 30. The signal TC indicates an end of a frequency dividing cycle of the frequency divider circuit 30. The synchronizing circuit 130 will wait to switch the first and the second multiplexers 110 and 120 not only until a certain matching of the phases of the first and the second oscillator frequencies $f_{oscA}$ and $f_{oscB}$ is detected, but also until the signal TC on line 160 indicates an end of the respective frequency dividing cycle.

In a preferred embodiment, the frequency divider circuit 30 is embodied by a counter circuit, preferably a decrementing counter, which receives on its CLOCK IN input the oscillator frequency $f_{osc}$ on line 25. The counter starts with loading the divider factor from line 50 and generating a positive (or negative) slope on line 35. At every new clock cycle of $f_{osc}$, the counter decrements its value (starting from DF) by one. When the counter reaches DF/2, it generates a negative (or positive) slope on line 35. The counter further decrements down to one, when it activates the signal TC on line 160. With the next cycle of $f_{osc}$, the counter finishes one output period of $f_{out}$ by generating a next positive (or negative) slope on line 35 and reloading the divider factor DF from line 50. Thus, the counter outputs on line 35 a sequence of negative and positive slope at the frequency $f_{out}=f_{osc}/DF$.

Figure 4A:
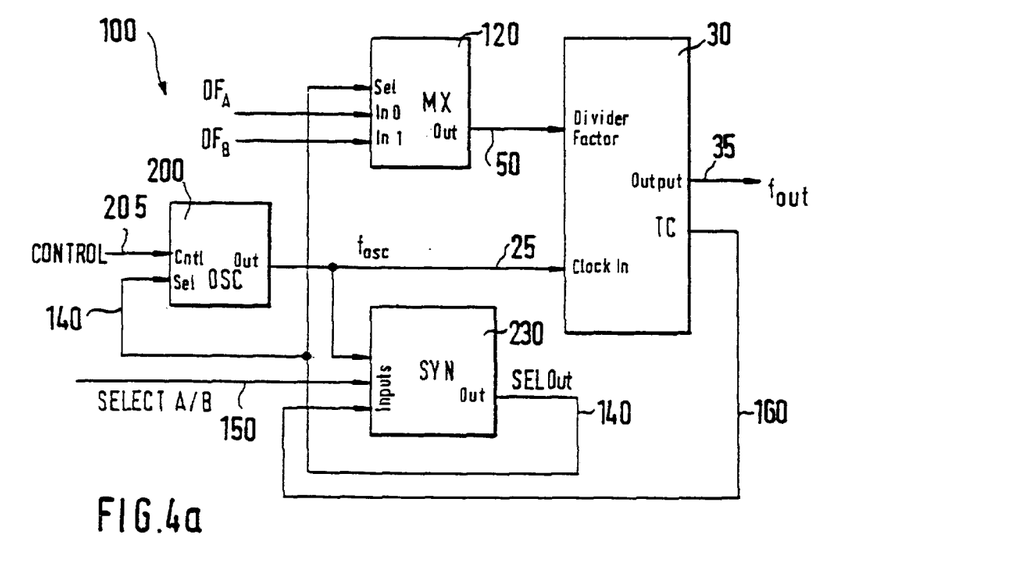

As apparent from FIG. 3a, it might require a relatively long time until the phases of the oscillator $f_{oscA}$ and $f_{oscB}$ match (to the requested degree) and, in particular, that the terminal count TC (additionally) coincides with the phase matching. This might lead to a relatively long time until the synchronizing circuit 130 allows a switching of the multiplexers 110 and 120. In order to keep this time short, at least one of the oscillators 20A and 20B preferably receives a signal PHASE CONTROL on respective input lines 170A and or 170B. The signals PHASE CONTROL on lines 170A and 170B are preferably controlled by the synchronizing circuit 130, but can be controlled by any other adequate circuit as known in the art. The signals PHASE CONTROL preferably cause the oscillator signal to be switched to to be delayed until the phases match. This can be accomplished by providing controllable delay lines with variable delay lengths controlled by the signals PHASE CONTROL FIG. 4a shows another preferred embodiment of the frequency-providing circuit 100 according to the invention. Instead of providing the two oscillators 20A and 20B, the frequency-providing circuit 100 according to FIG. 4A comprises only one oscillator circuit 200. The oscillator 200 is an oscillator, preferably a digital oscillator, which can be switched between two different and variable oscillating frequencies $f_{oscA}$ and $f_{oscB}$ substantially without requiring a settling time. The oscillator 200 is preferably embodied as a ring oscillator wherein the output signal of a delay chain is inverted and coupled back to the input of the chain.

The oscillator 200 receives a control signal CONTROL on a line 205 and the select signal SEL OUT on line 140. The signal CONTROL controls the setting as well of the currently selected oscillator frequency $f_{osc}$ as of the oscillator frequency to be switched to when the next valid signal SEL OUT on line 140 appears. The oscillator signal is output on line 25 and serves as input of the frequency divider circuit 30 and of a synchronizing circuit 230. The synchronizing circuit 230 receives as further inputs the signal SELECT A/B on line 150 and the terminal count signal TC on line 160. The synchronizing circuit 230 provides as output the signal SEL OUT on line 140 coupled to inputs of the oscillator circuit 200 and the multiplexer 120. The multiplexer 120 further receives the divider factors $DF_A$ and $DF_B$ and provides an output on line 50 to the frequency divider circuit 30. It is to be understood that the multiplexer 120, the frequency divider circuit 30 and the synchronizing circuit 230 can be embodied in accordance with the corresponding components in FIG. 3a.

Figure 4B:
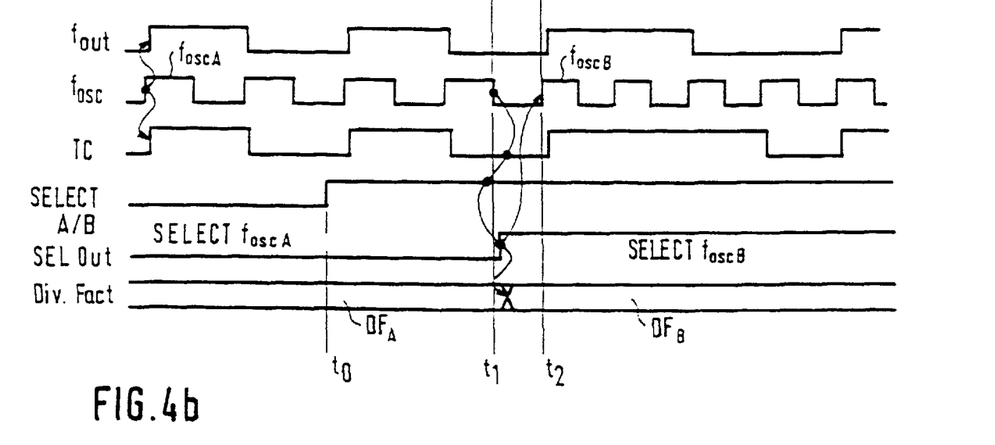
FIG. 4b depicts in a timing diagram an example for a frequency change of the frequency-providing circuit 100.

FIG. 4b depicts in a timing diagram an example for a frequency change of the frequency-providing circuit 100 in FIG. 4a. At first, the oscillator 200 provides an oscillator output with a frequency $f_{oscA}$ on line 25 to the frequency divider circuit 30. The frequency divider circuit 30 receives a divider factor $DF_A$ (with $DF_A=2$ in FIG. 4a) on line 50 leading to a frequency output on line 35 with $f_{out}=f_{oscA}/DF_A$ ($f_{out}=f_{oscA}/2$ in FIG. 4a). At a time $t_0$, the signal SELECT A/B gets 'high' indicating to switch the oscillator 200 from $f_{oscA}$ to $f_{oscB}$ and the multiplexer 120 to switch from divider factor $DF_A$ to a divider factor $DF_B$. At a time $t_1$, the negative edge of $f_{osc}$ coincides with a 'low' signal TC and a 'high' signal SELECT A/B causing the synchronizing circuit 230 to change the signal SEL OUT from 'low' to 'high'. The change in the signal SEL OUT causes the oscillator 200 to change at time $t_2$ its frequency from $f_{oscA}$ to $f_{oscB}$ at the end of the current period of $f_{oscA}$. Accordingly, the change in the signal SEL OUT causes the multiplexer 120 to change its output on line 50 from divider factor $DF_A$ to divider factor $DF_B$. The change of the oscillator frequency $f_{osc}$ from $f_{oscA}$ to $f_{oscB}$ and the change of the divider factor from $DF_A$ to $DF_B$ (in the example of FIG. 4b from $DF_A=2$ to $DF_B=4$) leads to a changed frequency $f_{out}=f_{oscA}/DF_B$ ($f_{out}=f_{oscB}/4$ in FIG. 4a).

Figure 5A:
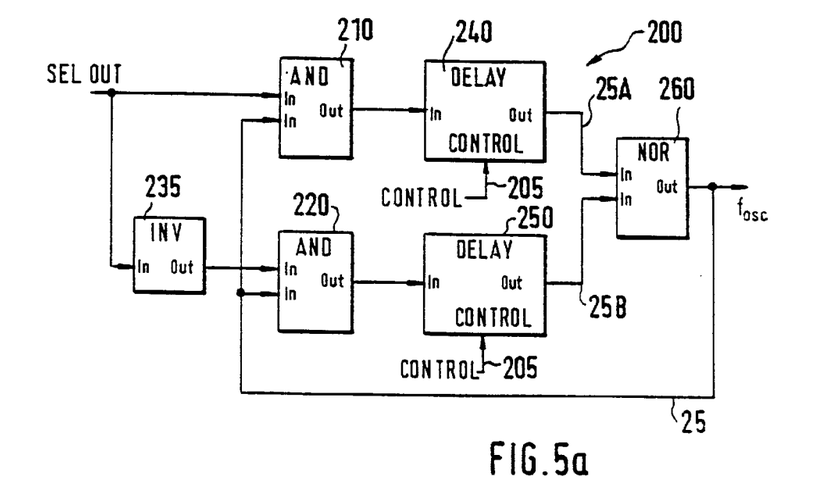
FIGS. 5a and 5c show preferred embodiments of the oscillator 200.

FIG. 5a shows a preferred embodiment of the oscillator 200. The oscillator 200 comprises a first AND gate 210 receiving the signal SEL OUT as input and a second AND gate 220 receiving the inverted signal SEL OUT from an inverter 235. An output of the AND gate 210 provides an input of a first variable delay cell 240 and an output of the second AND gate 220 provides an input of a second variable delay cell 250. The respective delay times of the first and second variable delay cells 240 and 250 are controlled by the signal CONTROL. Output of the first and second variable delay cells 240 and 250 are provided to a NOR gate 260. Line 25 as the output of the NOR gate 60 provides the output $f_{osc}$ of the oscillator 200 and is further coupled back to second inputs of the first AND and second AND gates 210 and 220.

The signal SEL OUT either selects the first AND gate 210, or via the inverter 235, the second AND gate 220. The selected AND gate 210 or 220 allows a 'high' signal on line 25 to propagate to the input of the corresponding variable delay cell 240 or 250 delaying that signal by the delay time as set by signal CONTROL The output of the inactive variable delay cell is always 'low', so that the NOR gate 260 can be used to combine the output signals of the two variable delay cells 240 and 250.

Figure 5B:
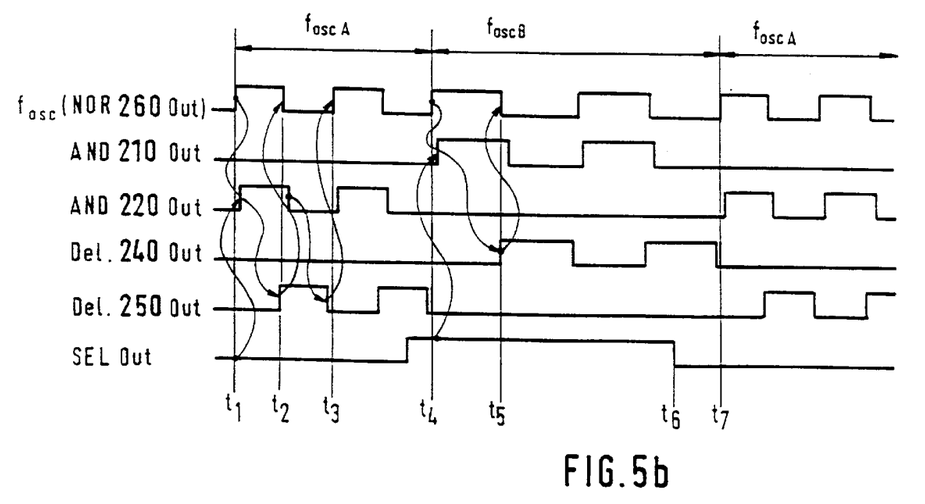

FIG. 5b depicts an example of a timing diagram in the circuit of FIG. 5a. In this example, the AND gate 210 is selected when the signal SEL OUT is 'low' and the AND gate 220 is selected when the signal SEL OUT is 'high'. At a time $t_1$, the signal SEL OUT is 'low' so that the output of inverter 235 is 'high' causing the output of AND gate 220 to become 'high' when the other input of AND gate 220 ($f_{osc}$) becomes high. At a time $t_2$, the rising edge at the output of AND gate 220 has been propagated to the delay cell 250 and is inverted by the NOR gate 260, thus leading to a failing edge at the output thereof ($f_{osc}$). Accordingly, the first falling edge in FIG. 5b of the output of AND gate 220 leads to a rising edge at the output of NOR gate 260 ($f_{osc}$) at a time $t_3$. After the signal SEL OUT has changed from 'low' to 'high', the rising edge of $f_{osc}$ at a time $t_4$ causes the output of AND gate 210 to become 'high'. At a time $t_5$, the rising edge of the input of the variable delay cell 240 has been propagated to its output causing the NOR gate 260 to change its output from 'high' to 'low'.

As apparent from FIG. 5b, the output $f_{osc}$ of oscillator 200 changes at time $t_4$ from $f_{oscA}$ to $f_{oscB}$. This occurs immediately and without a settling time at the end of a current period after the signal SEL OUT has indicated a frequency change. Accordingly, the output $f_{osc}$ changes from $f_{oscB}$ to $f_{oscA}$ at a time $t_7$ after the signal SEL OUT has changed at a time $t_6$ from 'high' to 'low'.

The arrangement of FIG. 5a allows changing the delay time of the unused variable delay cell 240 or 250 while the other one is in use. The select signal SEL OUT is preferably synchronized to change its state only when the output $f_{osc}$ of the oscillator 200 is 'low'. This can be accomplished e.g. by synchronizing the asynchronous signal SEL OUT with the signal TC of the frequency divider circuit 30 and the negative slope of the oscillator output $f_{osc}$.

Figure 5C:
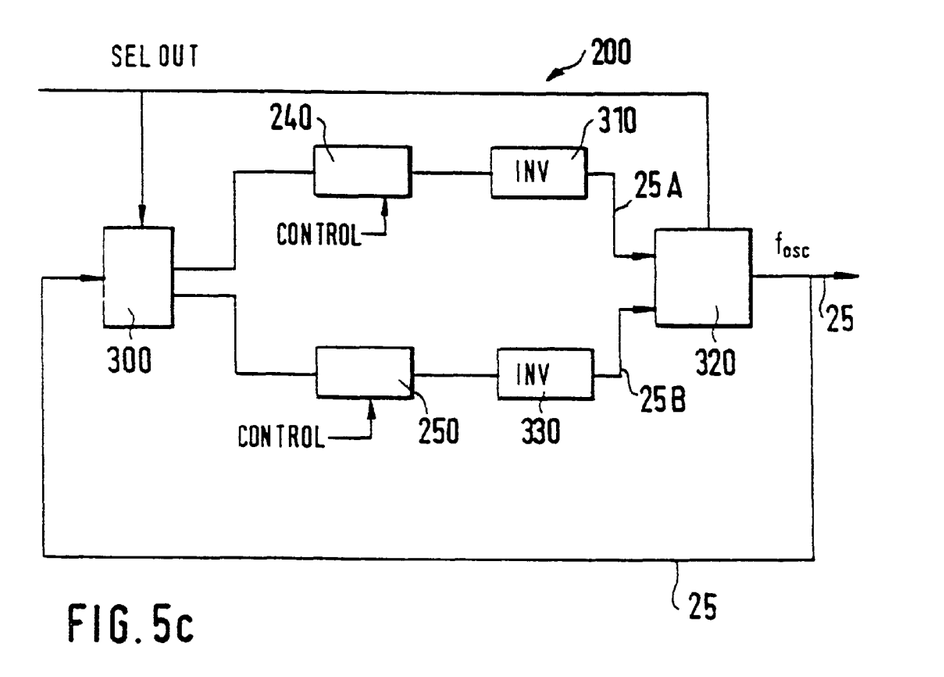

It is clear that the logic of the circuits in FIGS. 3a, 4a, and 5a can also be implemented by other logical means. FIG. 5c shows an example of another logical implementation at the circuit of FIG. 5a. The feedback loop 25 is coupled to an input of a switch 300 which switches the signal of line 25 either to the first variable delay cell 240 or to the second variable delay cell 250 in accordance with the setting of the signal SEL OUT. The output of the first variable delay cell 240 is inverted by an inverter 310 and coupled to an input of a multiplexer 320 which is also controlled by the signal SEL OUT and which provides the output $f_{osc}$ of the oscillator 200. Accordingly, the output of the second variable delay cell 250 is inverted by and inverter 330 and the output thereof is coupled to another input of the multiplexer 320.

It is also clear that the various signals, in particular the divider control signal and/or the signals CONTROL, PHASE CONTROL, SEL OUT, and/or SELECT A/B can also represent more than one signal or lines. As an example, the signal CONTROL in FIG. 5a or 5c can represent two different signals, one for the first variable delay cell 240 and one for the second variable delay cell 250. However, for the sake of simplicity those signals are depicted herein as single signals.

For the purposes of the invention, a frequency multiplying circuit or any other frequency-changing circuit can be applied instead of the frequency divider circuit 30. Accordingly, any controllable switching unit can be applied for the various multiplexers as referred to herein. Further more, more than two oscillators can be applied allowing a faster switching.

In the timing diagrams of FIGS. 3b, 4b, and 5b, a certain propagation time has been added as apparent e.g. from the slightly delayed output signal $f_{out}$ with respect to $f_{osc}$.

The variable delay cell 240 and/or 250 is preferable implemented by a variable delay cell as described in the European Patent Application No. 97 120 157.9 by the same applicant. The teaching of that application with respect to the variable delay cell is incorporated herein by reference.

The circuits of the invention can be easily embodied and/or integrated with modem semiconductor technologies such as CMOS or ECL.

What is claimed is:

1. A frequency-providing circuit for providing an output signal at a frequency $f_{out}$, the circuit comprising:
   a frequency-generating unit, receiving a frequency-selecting control signal, for providing a frequency output at a frequency $f_{osc}$, wherein the frequency-generating unit further comprises:
      a first oscillator, receiving a first oscillator control signal, for providing a first frequency output at a first oscillator frequency $f_{oscA}$,
      a second oscillator, receiving a second oscillator control signal, for providing a second frequency output at a second oscillator frequency $f_{oscB}$, and
      a frequency-selecting unit being controlled by the frequency-selecting control signal for selecting as the frequency output one of the first frequency output or the second frequency output,
   said frequency-providing circuit further comprising:
      a frequency-changing circuit, receiving the frequency output and a frequency-changing control signal, for deriving the output signal from the received frequency output, whereby the frequency $f_{out}$ of the output signal can be changed with respect to the frequency $f_{osc}$ by the frequency-changing circuit in accordance with the frequency-changing control signal, and
      a synchronizing circuit for synchronizing the frequency-selecting control signal and the frequency-changing control signal,
   whereby the frequency-generating unit is switchable between different frequencies substantially without a settling time.

2. The frequency-providing circuit of claim 1 wherein:
   the first oscillator comprises a first variable delay cell controlled by the first oscillator control signal, whereby an inverted output thereof is coupled back to an input thereof, and
   the second oscillator comprises a second variable delay cell controlled by the second oscillator control signal, whereby an inverted output thereof is coupled back to an input thereof.

3. The frequency-providing circuit according to claim 1, further comprising:
   a frequency-change selecting unit, receiving a first and a second frequency-changing signal and being controlled by a frequency-change selecting signal for selecting one of the first and second frequency-changing signals as the frequency-changing control signal.

4. The frequency-providing circuit of claim 3, wherein the synchronizing circuit receives a frequency-selecting signal and provides the frequency-selecting control signals and/or the frequency-changing control signal.

5. The frequency-providing circuit according to claim 1, wherein the synchronizing circuit is adapted to provide a synchronizing of a switching between the first and second oscillator frequencies $f_{oscA}$ and $f_{oscB}$.

6. The frequency-providing circuit according to claim 1, wherein the synchronizing circuit comprises means for disabling an application of a successive frequency-selecting control signal and/or frequency-changing control signal until the phases of the first and second oscillator frequencies $f_{oscA}$ and $f_{oscB}$ match within a given range.

7. The frequency-providing circuit according to claim 1, wherein the synchronizing circuit receives as inputs the first and second oscillator frequencies $f_{oscA}$ and $f_{oscB}$.

8. A frequency-providing circuit for providing an output signal at a frequency $f_{out}$, the circuit comprising:

- a first oscillator, receiving a first oscillator control signal, for providing a first frequency output at a first oscillator frequency $f_{oscA}$, and
- a frequency-changing circuit receiving a signal at a frequency $f_{osc}$ at a first input and a frequency-changing control signal at a second input for deriving the output signal therefrom, whereby the frequency $f_{out}$ of the output signal can be changed with respect to the frequency $f_{osc}$ by the frequency-changing circuit in accordance with the frequency-changing control signal,
- a second oscillator, receiving a second oscillator control signal, for providing a second frequency output at a second oscillator frequency $f_{oscB}$, and
- a frequency-selecting unit, receiving as inputs the first and second frequency outputs and being controlled by a frequency-selecting control signal for selecting one of the inputs as an output, whereby the output of the frequency-selecting unit is coupled to the first input of the frequency-changing circuit,
- a synchronizing circuit, receiving the first frequency output and the second frequency output, for providing the frequency selecting control signal upon phase matching of the first frequency output and the second frequency output to a certain degree.

* * * * *